United States Patent
Kim et al.

(10) Patent No.: US 10,255,958 B1
(45) Date of Patent: Apr. 9, 2019

(54) SEMICONDUCTOR DEVICES AND SEMICONDUCTOR SYSTEMS INCLUDING THE SAME

(71) Applicant: SK hynix Inc., Icheon-si, Gyeonggi-do (KR)

(72) Inventors: Haksong Kim, Seoul (KR); Jaeil Kim, Yongin-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/046,514

(22) Filed: Jul. 26, 2018

(30) Foreign Application Priority Data

Jan. 18, 2018 (KR) .................. 10-2018-0006507

(51) Int. Cl.
*G11C 7/00* (2006.01)
*G06F 1/10* (2006.01)
*G11C 7/22* (2006.01)
*G11C 7/10* (2006.01)
*G06F 13/16* (2006.01)

(52) U.S. Cl.
CPC .......... *G11C 7/222* (2013.01); *G06F 13/1689* (2013.01); *G11C 7/1063* (2013.01); *G11C 7/1084* (2013.01); *G11C 7/1087* (2013.01)

(58) Field of Classification Search
CPC ..... G11C 7/222; G11C 7/1084; G11C 7/1063; G11C 7/1087; G06F 13/1689
See application file for complete search history.

(56) References Cited

U.S. PATENT DOCUMENTS

| 5,813,041 A * | 9/1998 | McIntyre, Jr. ...... G06F 12/0215 711/167 |
| 7,865,756 B2 * | 1/2011 | Oh ........................... G06F 1/10 375/240.28 |
| 8,743,652 B2 * | 6/2014 | Kondo ..................... G11C 8/18 365/230.06 |
| 8,804,443 B2 * | 8/2014 | Song ..................... G11C 7/1006 365/194 |
| 9,570,134 B1 * | 2/2017 | Ferrucci .................. G11C 8/10 |
| 9,588,922 B2 * | 3/2017 | Hunsaker .............. G06F 13/364 |
| 9,851,744 B2 * | 12/2017 | Dearth ..................... G06F 1/10 |
| 9,996,496 B2 * | 6/2018 | Rivers ................... G06F 13/385 |
| 10,109,326 B2 * | 10/2018 | Ku ........................... G11C 7/10 |
| 2016/0172013 A1 | 6/2016 | Dearth et al. |

FOREIGN PATENT DOCUMENTS

KR    1020180038344 A    4/2018

* cited by examiner

*Primary Examiner* — Kenneth B Wells
(74) *Attorney, Agent, or Firm* — William Park & Associates Ltd.

(57) ABSTRACT

A semiconductor device includes a latch circuit and a first command generation circuit. The latch circuit generates a first internal control signal and a first internal chip selection signal in synchronization with an internal clock signal. The first command generation circuit generates a first normal command if the first internal chip selection signal having an enabled state is inputted in synchronization with an inverted internal clock signal. The first command generation circuit also generates a first control command if the first internal control signal having a second predetermined state is inputted in synchronization with the inverted internal clock signal.

20 Claims, 23 Drawing Sheets

FIG.22

| Function | CS | CA1 | CA2 | CA3 | CA4 | CA5 | CA10 |
|---|---|---|---|---|---|---|---|
| Mode Register Write | L | H | L | H | L | L | X |
| | H | X | X | X | X | X | H |
| Mode Register Read | L | H | L | H | L | H | X |
| | H | X | X | X | X | X | H |

SEMICONDUCTOR DEVICES AND SEMICONDUCTOR SYSTEMS INCLUDING THE SAME

CROSS-REFERENCE TO RELATED APPLICATIONS

The present application claims priority under 35 U.S.C 119(a) to Korean Application No. 10-2018-0006507, filed on Jan. 18, 2018, which is incorporated herein by reference in its entirety.

BACKGROUND

1. Technical Field

Embodiments of the present disclosure relate to semiconductor devices generating internal commands and semiconductor systems including the same.

2. Related Art

Recently, social networking services (SNS), machine to machine (M2M) networks utilizing internet of things (IoT), sensor networks, or the like have been widely used in communication systems including semiconductor systems. Accordingly, it may be necessary to increase a storage capacity of the semiconductor systems. A semiconductor module (e.g., a memory module) employed in the semiconductor systems may be realized to include a plurality of semiconductor devices to increase the storage capacity of the semiconductor systems.

SUMMARY

According to an embodiment, a semiconductor device may include a latch circuit and a first command generation circuit. The latch circuit may generate a first internal control signal and a first internal chip selection signal in synchronization with an internal clock signal. The first command generation circuit may generate a first normal command if the first internal chip selection signal having an enabled state is inputted to the first command generation circuit in synchronization with an inverted internal clock signal when the first internal control signal having a first predetermined state is inputted to the first command generation circuit in synchronization with the internal clock signal. In addition, the first command generation circuit may generate a first control command if the first internal control signal having a second predetermined state is inputted to the first command generation circuit in synchronization with the inverted internal clock signal while the first internal control signal having the first predetermined state is inputted to the first command generation circuit in synchronization with the internal clock signal.

According to another embodiment, a semiconductor device includes a first command generation circuit and a second command generation circuit. The first command generation circuit may generate a first normal command if a first internal chip selection signal having an enabled state is inputted to the first command generation circuit in synchronization with an inverted internal clock signal while a first internal control signal having a first predetermined state is inputted to the first command generation circuit in synchronization with an internal clock signal. In addition, the first command generation circuit may generate a first control command if the first internal control signal having a second predetermined state is inputted to the first command generation circuit in synchronization with the inverted internal clock signal while the first internal control signal having the first predetermined state is inputted to the first command generation circuit in synchronization with the internal clock signal. The second command generation circuit may generate a second normal command if a second internal chip selection signal having an enabled state is inputted to the second command generation circuit in synchronization with the internal clock signal while a second internal control signal having a third predetermined state is inputted to the second command generation circuit in synchronization with the inverted internal clock signal. Moreover, the second command generation circuit may generate a second control command if the second internal control signal having a fourth predetermined state is inputted to the second command generation circuit in synchronization with the internal clock signal while the second internal control signal having the third predetermined state is inputted to the second command generation circuit in synchronization with the inverted internal clock signal.

According to another embodiment, a semiconductor system may include a semiconductor controller and a semiconductor module. The semiconductor controller may generate an external control signal, an external chip selection signal and an external clock signal. The semiconductor module may receive the external control signal, the external chip selection signal, and the external clock signal to communicate data with the semiconductor controller. The semiconductor module may include a register clock driver and a first command generation circuit. The register clock driver may generate a control signal, a chip selection signal, and a clock signal from the external control signal, the external chip selection signal, and the external clock signal. The first command generation circuit may generate a first normal command and a first control command in response to the control signal, the chip selection signal, and the clock signal. The first normal command may be generated if a first internal chip selection signal having an enabled state is inputted to the first command generation circuit in synchronization with an inverted internal clock signal while a first internal control signal having a first predetermined state is inputted to the first command generation circuit in synchronization with an internal clock signal. The first control command may be generated if the first internal control signal having a second predetermined state is inputted to the first command generation circuit in synchronization with the inverted internal clock signal while the first internal control signal having the first predetermined state is inputted to the first command generation circuit in synchronization with the internal clock signal.

BRIEF DESCRIPTION OF THE DRAWINGS

FIG. 22 is a table illustrating logic level combinations of a control signal when a normal command and a control command are generated.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
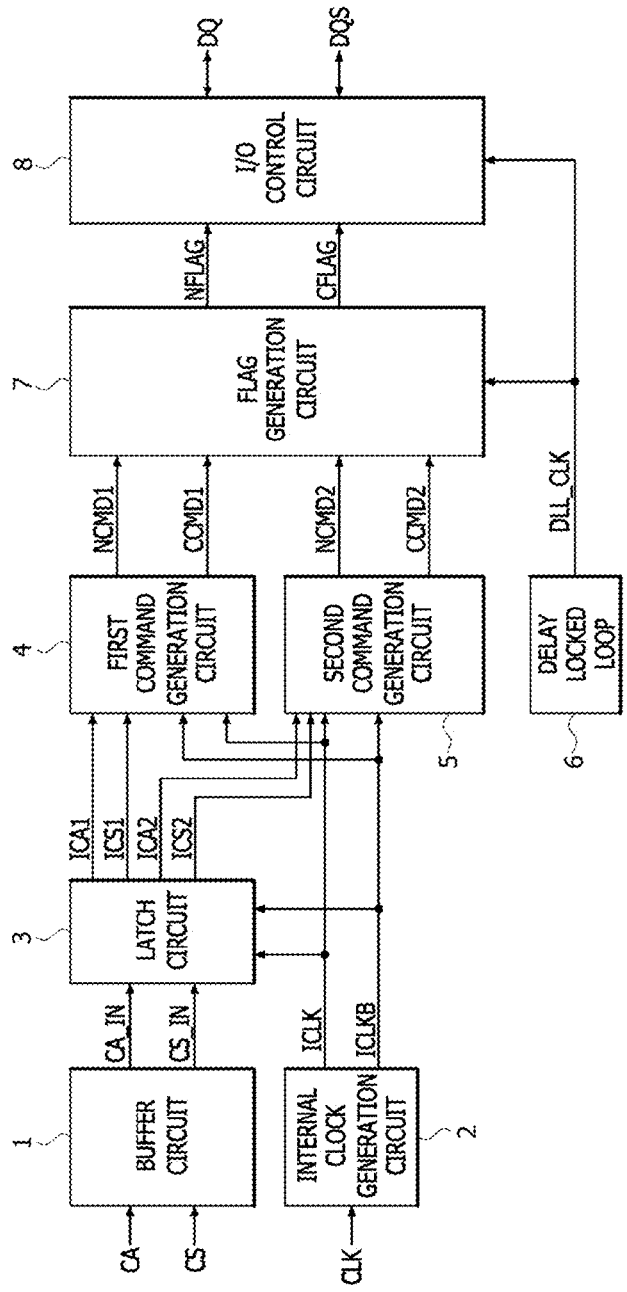
FIG. 1 is a block diagram illustrating a configuration of a semiconductor device according to an embodiment of the present disclosure.

As illustrated in FIG. 1, a semiconductor device according to an embodiment may include a buffer circuit 1, an internal clock generation circuit 2, a latch circuit 3, a first command generation circuit 4, a second command generation circuit 5, a delay locked loop 6, a flag generation circuit 7, and an input/output (I/O) control circuit 8.

The buffer circuit 1 may generate an input control signal CA_IN and an input chip selection signal CS_IN in response to a control signal CA and a chip selection signal CS. The buffer circuit 1 may buffer the control signal CA to generate the input control signal CA_IN. The control signal CA may include at least one of a command and an address. The control signal CA may include a plurality of bits. The buffer circuit 1 may buffer the chip selection signal CS to generate the input chip selection signal CS_IN. The chip selection signal CS may be enabled to activate an operation of a semiconductor module.

The internal clock generation circuit 2 may generate an internal clock signal ICLK and an inverted internal clock signal ICLKB from a clock signal CLK. The internal clock generation circuit 2 may generate the internal clock signal ICLK which is toggled when (referred to as a rising edge) a level of the clock signal CLK is changed from a logic "low" level to a logic "high" level. The internal clock generation circuit 2 may generate the inverted internal clock signal ICLKB which is toggled when (referred to as a falling edge) a level of the clock signal CLK is changed from a logic "high" level into a logic "low" level. A cycle time of the internal clock signal ICLK and the inverted internal clock signal ICLKB may be set to twice a cycle time of the clock signal CLK.

The latch circuit 3 may generate a first internal control signal ICA1, a first internal chip selection signal ICS1, a second internal control signal ICA2, and a second internal chip selection signal ICS2 from the input control signal CA_IN and the input chip selection signal CS_IN in response to the internal clock signal ICLK and the inverted internal clock signal ICLKB. The latch circuit 3 may be synchronized with the internal clock signal ICLK to latch the input control signal CA_IN and to output the latched input control signal as the first internal control signal ICA1. The first internal control signal ICA1 may include a plurality of bits. The latch circuit 3 may be synchronized with the internal clock signal ICLK to latch the input chip selection signal CS_IN and to output the latched input chip selection signal as the first internal chip selection signal ICS1. The first internal chip selection signal ICS1 may include a plurality of bits. The latch circuit 3 may be synchronized with the inverted internal clock signal ICLKB to latch the input control signal CA_IN and to output the latched input control signal as the second internal control signal ICA2. The second internal control signal ICA2 may include a plurality of bits. The latch circuit 3 may be synchronized with the inverted internal clock signal ICLKB to latch the input chip selection signal CS_IN and to output the latched input chip selection signal as the second internal chip selection signal ICS2. The second internal chip selection signal ICS2 may include a plurality of bits.

The first command generation circuit 4 may generate a first normal command NCMD1 and a first control command CCMD1 in response to the internal clock signal ICLK, the inverted internal clock signal ICLKB, the first internal control signal ICA1, and the first internal chip selection signal ICS1. If an enabled first internal chip selection signal ICS1 is inputted to the first command generation circuit 4 in synchronization with the inverted internal clock signal IBLKB while the first internal control signal ICA1 having a predetermined state is inputted to the first command generation circuit 4 in synchronization with the internal clock signal ICLK, the first command generation circuit 4 may generate an enabled first normal command NCMD1. In other words, the first command generation circuit 4 may generate the first normal command NCMD1 which is enabled if the first internal chip selection signal ICS1 having an enabled state is inputted to the first command generation circuit 4 in synchronization with the inverted internal clock signal ICLKB while the first internal control signal ICA1 having a predetermined state is inputted to the first command generation circuit 4 in synchronization with the internal clock signal ICLK. If the first internal control signal ICA1 is a signal having one bit, the predetermined state of the first internal control signal ICA1 may be set to a logic "low" level or a logic "high" level according to embodiments. Alternatively, if the first internal control signal ICA1 is a signal having a plurality of bits, the predetermined state of the first internal control signal ICA1 may correspond to a predetermined logic level combination. The enabled state of the first internal chip selection signal ICS1 may be set to a logic "low" level or a logic "high" level according to embodiments. The first normal command NCMD1 may be generated to activate operations of semiconductor devices (120<1:4> of FIG. 23) included in a semiconductor module (1001 of FIG. 23). The first normal command NCMD1 may be generated to activate a mode register write operation and a mode register read operation for setting information on operation of the semiconductor devices (120<1:4> of FIG. 23). When the first internal control signal ICA1 having a predetermined state is inputted to the first command generation circuit 4 in synchronization with the inverted internal clock signal ICLKB while the first internal control signal ICA1 having a predetermined state is inputted to the first command generation circuit 4 in synchronization with the internal clock signal ICLK, the first command generation circuit 4 may generate an enabled first control command CCMD1. In other words, the first command generation circuit 4 may generate the first control command CCMD1 which is enabled if the first internal control signal ICA1 having a predetermined state is inputted to the first command generation circuit 4 in synchronization with the inverted internal clock signal ICLKB while the first internal control signal ICA1 having a predetermined state is inputted to the first command generation circuit 4 in synchronization with the internal clock signal ICLK. The predetermined state of the first internal control signal ICA1 which is inputted to the first command generation circuit 4 in synchronization with the internal clock signal ICLK may be set to be different than the predetermined state of the first internal control signal ICA1 which is inputted to the first command generation circuit 4 in synchronization with the inverted internal clock signal ICLKB according to embodiments. The first control command CCMD1 may be generated to activate an operation of a register clock driver RCD (100 of FIG. 23) included in the semiconductor module (1001 of FIG. 23). The first control command CCMD1 may be generated to activate a mode register write operation and a mode register read operation for setting information on operation of the register clock driver RCD (100 of FIG. 23).

The second command generation circuit 5 may generate a second normal command NCMD2 and a second control command CCMD2 in response to the internal clock signal ICLK, the inverted internal clock signal ICLKB, the second internal control signal ICA2, and the second internal chip selection signal ICS2. If an enabled second internal chip selection signal ICS2 is inputted to the second command generation circuit 5 in synchronization with the internal clock signal ICLK while the second internal control signal ICA2 having a predetermined state is inputted to the second command generation circuit 5 in synchronization with the inverted internal clock signal ICLKB, the second command generation circuit 5 may generate an enabled second normal command NCMD2. In other words, the second command generation circuit 5 may generate the second normal command NCMD2 which is enabled if the second internal chip selection signal ICS2 having an enabled state is inputted to the second command generation circuit 5 in synchronization with the internal clock signal ICLK while the second internal control signal ICA2 having a predetermined state is inputted to the second command generation circuit 5 in synchronization with the inverted internal clock signal ICLKB. If the second internal control signal ICA2 is signal having one bit, the predetermined state of the second internal control signal ICA2 may be set to a logic "low" level or a logic "high" level according to embodiments. Alternatively, if the second internal control signal ICA2 is signal including a plurality of bits, the predetermined state of the second internal control signal ICA2 may correspond to a predetermined logic level combination. The enabled state of the second internal chip selection signal ICS2 may be set to a logic "low" level or a logic "high" level according to embodiments. The second normal command NCMD2 may be generated to activate operations of the semiconductor devices (120<1:4> of FIG. 23) included in the semiconductor module (1001 of FIG. 23). The second normal command NCMD2 may be generated to activate a mode register write operation and a mode register read operation for setting information on operation of the semiconductor devices (120<1:4> of FIG. 23). If the second internal control signal ICA2 having a predetermined state is inputted to the second command generation circuit 5 in synchronization with the internal clock signal ICLK when the second internal control signal ICA2 having a predetermined state is inputted to the second command generation circuit 5 in synchronization with the inverted internal clock signal ICLB, the second command generation circuit 5 may generate an enabled second control command CCMD2. In other words, the second command generation circuit 5 may generate the second control command CCMD2 which is enabled if the second internal control signal ICA2 having a predetermined state is inputted to the second command generation circuit 5 in synchronization with the internal clock signal ICLK while the second internal control signal ICA2 having a predetermined state is inputted to the second command generation circuit 5 in synchronization with the inverted internal clock signal ICLB. The predetermined state of the second internal control signal ICA2 which is inputted to the second command generation circuit 5 in synchronization with the internal clock signal ICLK may be set to be different than the predetermined state of the second internal control signal ICA2 which is inputted to the second command generation circuit 5 in synchronization with the inverted internal clock signal ICLKB according to embodiments. The second control command CCMD2 may be generated to activate an operation of the register clock driver RCD (100 of FIG. 23) included in the semiconductor module (1001 of FIG. 23). The operation of the register clock driver RCD (100 of FIG. 23) may include a mode register write operation and a mode register read operation. The second control command CCMD2 may be generated to activate a mode register write operation and a mode register read operation for setting information on operation of the register clock driver RCD (100 of FIG. 23).

The flag generation circuit 7 may generate a normal flag NFLAG and a control flag CFLAG from the first normal command NCMD1, the first control command CCMD1, the second normal command NCMD2, and the second control command CCMD2 in response to a delay locked clock signal DLL_CLK generated by the delay locked loop 6. The flag generation circuit 7 may be synchronized with the delay locked clock signal DLL_CLK to output the first normal command NCMD1 or the second normal command NCMD2 as the normal flag NFLAG. The flag generation circuit 7 may output the first normal command NCMD1 as the normal flag NFLAG in synchronization with the delay locked clock signal DLL_CLK if the first normal command NCMD1 is generated. The flag generation circuit 7 may output the second normal command NCMD2 as the normal flag NFLAG in synchronization with the delay locked clock signal DLL_CLK if the second normal command NCMD2 is generated. The flag generation circuit 7 may be synchronized with the delay locked clock signal DLL_CLK to output the first control command CCMD1 or the second control command CCMD2 as the control flag CFLAG. The flag generation circuit 7 may output the first control command CCMD1 as the control flag CFLAG in synchronization with the delay locked clock signal DLL_CLK if the first control command CCMD1 is generated. The flag generation circuit 7 may output the second control command CCMD2 as the control flag CFLAG in synchronization with the delay locked clock signal DLL_CLK if the second control command CCMD2 is generated.

The I/O control circuit 8 may receive the normal flag NFLAG and the control flag CFLAG to control the input of data DQ and a data strobe signal DQS into the I/O control circuit 8 or the output of the data DQ and the data strobe signal DQS from the I/O control circuit 8, in response to the delay locked clock signal DLL_CLK. The I/O control circuit 8 may receive or output the data DQ and the data strobe signal DQS if the normal flag NFLAG is generated. The I/O control circuit 8 may receive or output the data DQ and the data strobe signal DQS if the control flag CFLAG is generated.

Figure 2:
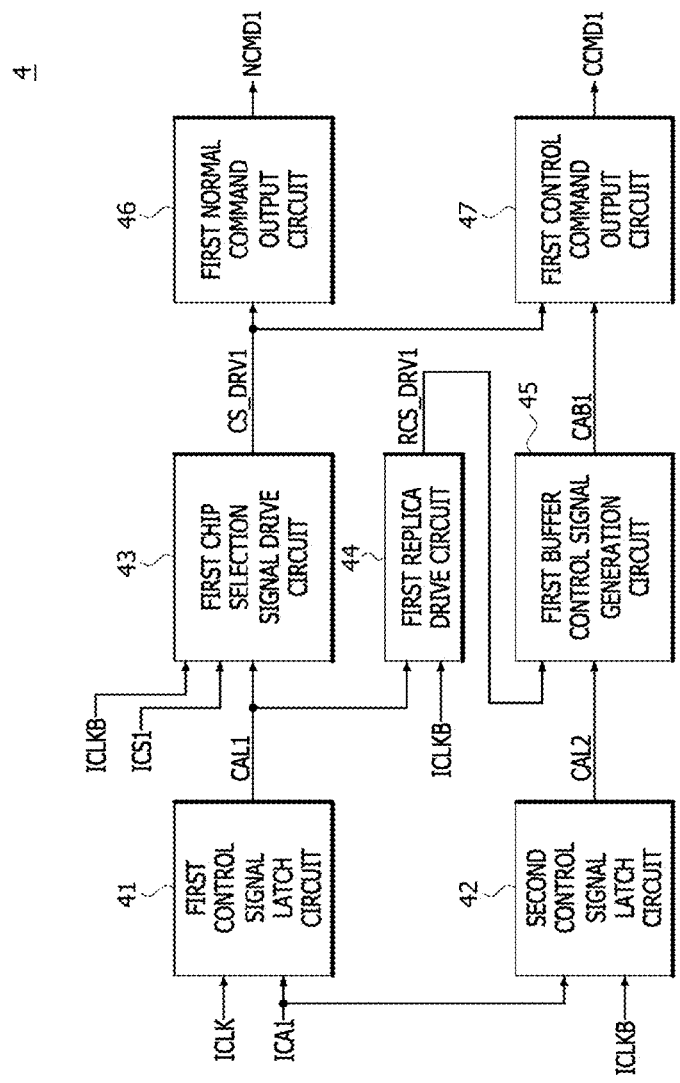
FIG. 2 is a block diagram illustrating a configuration of an example of a first command generation circuit included in the semiconductor device of FIG. 1.

Referring to FIG. 2, the first command generation circuit 4 may include a first control signal latch circuit 41, a second control signal latch circuit 42, a first chip selection signal drive circuit 43, a first replica drive circuit 44, a first buffer control signal generation circuit 45, a first normal command output circuit 46, and a first control command output circuit 47.

The first control signal latch circuit 41 may be synchronized with the internal clock signal ICLK to latch the first internal control signal ICA1 and to generate a first latched control signal CAL1. The first control signal latch circuit 41 may latch the first internal control signal ICA1 to output the latched first internal control signal as the first latched control signal CAL1 if the first internal control signal ICA1 having a predetermined state is inputted to the first control signal latch circuit 41 in synchronization with a predetermined edge of the internal clock signal ICLK. The predetermined edge of the internal clock signal ICLK may be set as a rising edge or a falling edge according to embodiments. If the first internal control signal ICA1 is a signal having one bit, the predetermined state of the first internal control signal ICA1 may be set to a logic "low" level or a logic "high" level according to embodiments. Alternatively, if the first internal control signal ICA1 is a signal including a plurality of bits, the predetermined state of the first internal control signal ICA1 may correspond to a predetermined logic level combination.

The second control signal latch circuit 42 may be synchronized with the inverted internal clock signal ICLKB to latch the first internal control signal ICA1 and to generate a second latched control signal CAL2. The second control signal latch circuit 42 may latch the first internal control signal ICA1 to output the latched first internal control signal as the second latched control signal CAL2 if the first internal control signal ICA1 having a predetermined state is inputted to the second control signal latch circuit 42 in synchronization with a predetermined edge of the inverted internal clock signal ICLKB. The predetermined edge of the inverted internal clock signal ICLKB may be set as a rising edge or a falling edge according to embodiments. If the first internal control signal ICA1 is a signal having one bit, the predetermined state of the first internal control signal ICA1 may be set to a logic "low" level or a logic "high" level according to embodiments. Alternatively, if the first internal control signal ICA1 is a signal including a plurality of bits, the predetermined state of the first internal control signal ICA1 may correspond to a predetermined logic level combination.

The first chip selection signal drive circuit 43 may generate a first chip selection drive signal CS_DRV1 in response to the inverted internal clock signal ICLKB, the first latched control signal CAL1 and the first internal chip selection signal ICS1. The first chip selection signal drive circuit 43 may drive the first chip selection drive signal CS_DRV1 if the first internal chip selection signal ICS1 having a predetermined state is inputted to the first chip selection signal drive circuit 43 in synchronization with the inverted internal clock signal ICLKB while the first latched control signal CAL1 having a predetermined state is inputted to the first chip selection signal drive circuit 43. The first chip selection signal drive circuit 43 may drive the first chip selection drive signal CS_DRV1 at a predetermined edge of the inverted internal clock signal ICLKB. The predetermined edge of the inverted internal clock signal ICLKB may be set as a rising edge or a falling edge according to embodiments. If the first latched control signal CAL1 is a signal having one bit, the predetermined state of the first latched control signal CAL1 may be set to a logic "low" level or a logic "high" level according to embodiments. Alternatively, if the first latched control signal CAL1 is a signal including a plurality of bits, the predetermined state of the first latched control signal CAL1 may correspond to a predetermined logic level combination. In addition, if the first internal chip selection signal ICS1 is a signal having one bit, the predetermined state of the first internal chip selection signal ICS1 may be set to a logic "low" level or a logic "high" level according to embodiments. Alternatively, if the first internal chip selection signal ICS1 is a signal including a plurality of bits, the predetermined state of the first internal chip selection signal ICS1 may correspond to a predetermined logic level combination. The first chip selection signal drive circuit 43 may drive the first chip selection drive signal CS_DRV1 to a power supply voltage or a ground voltage according to embodiments.

The first replica drive circuit 44 may generate a first replica chip selection drive signal RCS_DRV1 in response to the inverted internal clock signal ICLKB and the first latched control signal CAL1. The first replica drive circuit 44 may be synchronized with the inverted internal clock signal ICLKB to drive the first replica chip selection drive signal RCS_DRV1 while the first latched control signal CAL1 having a predetermined state is inputted to the first replica drive circuit 44. The first replica drive circuit 44 may drive the first replica chip selection drive signal RCS_DRV1 at a predetermined edge of the inverted internal clock signal ICLKB. The predetermined edge of the inverted internal clock signal ICLKB may be set as a rising edge or a falling edge according to embodiments. If the first latched control signal CAL1 is a signal having one bit, the predetermined state of the first latched control signal CAL1 may be set to a logic "low" level or a logic "high" level according to embodiments. Alternatively, if the first latched control signal CAL1 is a signal including a plurality of bits, the predetermined state of the first latched control signal CAL1 may correspond to a predetermined logic level combination. The first replica drive circuit 44 may drive the first replica chip selection drive signal RCS_DRV1 to a power supply voltage or a ground voltage according to embodiments.

The first buffer control signal generation circuit 45 may generate a first buffer control signal CAB1 from the second latched control signal CAL2 in response to the first replica chip selection drive signal RCS_DRV1. The first buffer control signal generation circuit 45 may buffer the second latched control signal CAL2 to generate the first buffer control signal CAB1 if the first replica chip selection drive signal RCS_DRV1 having a predetermined state is inputted to the first buffer control signal generation circuit 45. If the first replica chip selection drive signal RCS_DRV1 is a signal having one bit, the predetermined state of the first replica chip selection drive signal RCS_DRV1 may be set as a logic "low" level or a logic "high" level according to embodiments. Alternatively, if the first replica chip selection drive signal RCS_DRV1 is a signal including a plurality of bits, the predetermined state of the first replica chip selection drive signal RCS_DRV1 may correspond to a predetermined logic level combination.

The first normal command output circuit 46 may generate the first normal command NCMD1 in response to the first chip selection drive signal CS_DRV1. The first normal command output circuit 46 may buffer the first chip selection drive signal CS_DRV1 to generate the first normal command NCMD1.

The first control command output circuit 47 may generate the first control command CCMD1 in response to the first chip selection drive signal CS_DRV1 and the first buffer control signal CAB1. The first control command output circuit 47 may buffer the first buffer control signal CAB1 to generate the first control command CCMD1 while the first chip selection drive signal CS_DRV1 having a predetermined state is inputted to the first control command output circuit 47. If the first chip selection drive signal CS_DRV1 is a signal having one bit, the predetermined state of the first chip selection drive signal CS_DRV1 may be set to a logic "low" level or a logic "high" level according to embodiments. Alternatively, if the first chip selection drive signal CS_DRV1 is a signal including a plurality of bits, the predetermined state of the first chip selection drive signal CS_DRV1 may correspond to a predetermined logic level combination.

Figure 3:
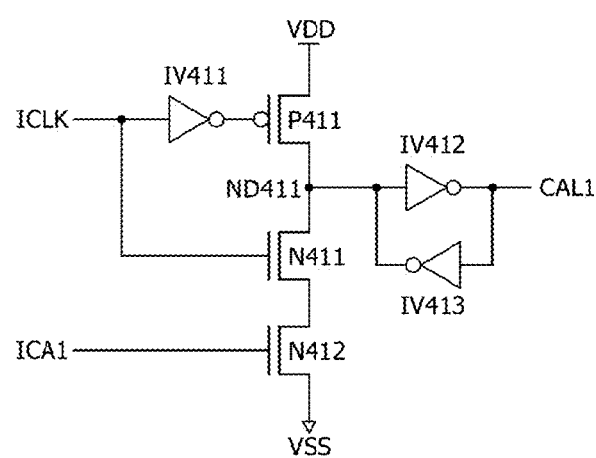
FIG. 3 is a circuit diagram illustrating an example of a first control signal latch circuit included in the first command generation circuit of FIG. 2.

Referring to FIG. 3, the first control signal latch circuit 41 may include inverters IV411, IV412, and IV413, a PMOS transistor P411, and NMOS transistors N411 and N412. The inverter IV411 may inversely buffer the internal clock signal ICLK to output the inversely buffered internal clock signal. The PMOS transistor P411 may drive a node ND411 to a power supply voltage VDD if an output signal of the inverter IV411 has a logic "low" level. The NMOS transistors N411 and N412 may be coupled in series between the node ND411 and a ground voltage VSS terminal. The NMOS transistor N411 may be synchronized with a rising edge of the internal clock signal ICLK to drive the node ND411 to the ground voltage VSS if the first internal control signal ICA1 having a logic "high" level is inputted to a gate of the NMOS transistor N412. The inverters IV412 and IV413 may constitute a latch circuit which latches a signal of the node ND411 and may inversely buffer the signal of the node ND411 to output the signal as the first latched control signal CAL1. That is, the first control signal latch circuit 41 may be synchronized with a rising edge of the internal clock signal ICLK to generate the first latched control signal CAL1 having a logic "high" level if the first internal control signal ICA1 having a logic "high" level is inputted to the first control signal latch circuit 41.

Figure 4:
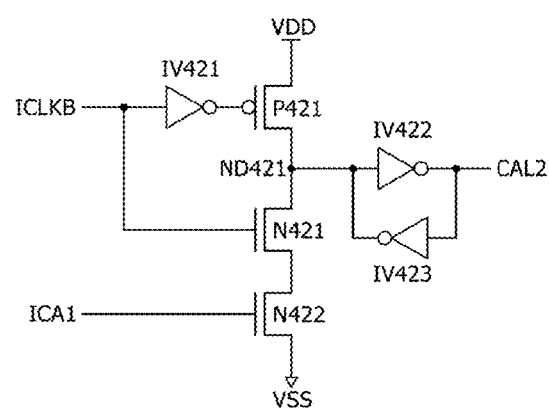
FIG. 4 is a circuit diagram illustrating an example of a second control signal latch circuit included in the first command generation circuit of FIG. 2.

Referring to FIG. 4, the second control signal latch circuit 42 may include inverters IV421, IV422, and IV423, a PMOS transistor P421, and NMOS transistors N421 and N422. The inverter IV421 may inversely buffer the inverted internal clock signal ICLKB to output the inversely buffered signal of the inverted internal clock signal ICLKB. The PMOS transistor P421 may drive a node ND421 to the power supply voltage VDD if an output signal of the inverter IV421 has a logic "low" level. The NMOS transistors N421 and N422 may be coupled in series between the node ND421 and the ground voltage VSS terminal. The NMOS transistor N421 may be synchronized with a rising edge of the inverted internal clock signal ICLKB to drive the node ND421 to the ground voltage VSS if the first internal control signal ICA1 having a logic "high" level is inputted to a gate of the NMOS transistor N422. The inverters IV422 and IV423 may constitute a latch circuit which latches a signal of the node ND421 and may inversely buffer the signal of the node ND421 to output the signal as the second latched control signal CAL2. That is, the second control signal latch circuit 42 may be synchronized with a rising edge of the inverted internal clock signal ICLKB to generate the second latched control signal CAL2 having a logic "high" level if the first internal control signal ICA1 having a logic "high" level is inputted to the second control signal latch circuit 42.

Figure 5:
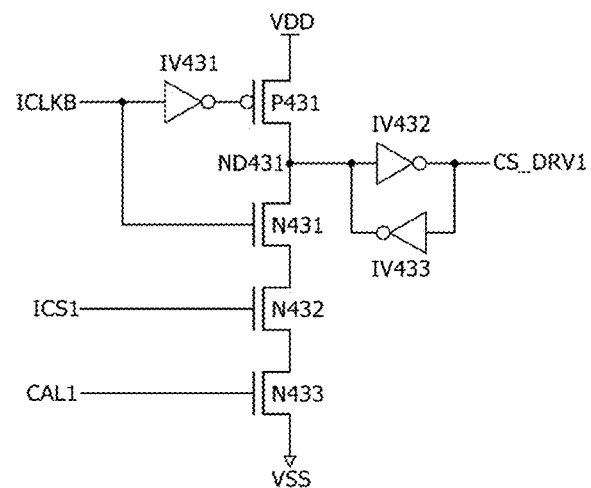
FIG. 5 is a circuit diagram illustrating an example of a first chip selection signal drive circuit included in the first command generation circuit of FIG. 2.

Referring to FIG. 5, the first chip selection signal drive circuit may include inverters IV431, IV432, and IV433, a PMOS transistor P431 and NMOS transistors N431, N432, and N433. The inverter IV431 may inversely buffer the inverted internal clock signal ICLKB to output the inversely buffered signal of the inverted internal clock signal ICLKB. The PMOS transistor P431 may drive a node ND431 to the power supply voltage VDD if an output signal of the inverter IV431 has a logic "low" level. The NMOS transistors N431, N432, and N433 may be coupled in series between the node ND431 and the ground voltage VSS terminal. The NMOS transistor N431 may be synchronized with a rising edge of the inverted internal clock signal ICLKB to drive the node ND431 to the ground voltage VSS if the first internal chip selection signal ICS1 having a logic "high" level and the first latched control signal CAL1 having a logic "high" level are respectively inputted to gates of the NMOS transistors N432 and N433. The inverters IV432 and IV433 may constitute a latch circuit which latches a signal of the node ND431 and may inversely buffer the signal of the node ND431 to output the signal as the first chip selection drive signal CS_DRV1. That is, the first chip selection signal drive circuit 43 may be synchronized with a rising edge of the inverted internal clock signal ICLKB to generate the first chip selection drive signal CS_DRV1 having a logic "high" level if the first internal chip selection signal ICS1 having a logic "high" level and the first latched control signal CAL1 having a logic "high" level are inputted to the first chip selection signal drive circuit 43.

Figure 6:
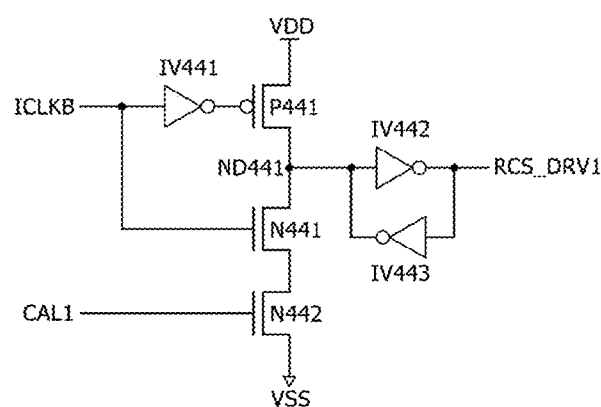
FIG. 6 is a circuit diagram illustrating an example of a first replica drive circuit included in the first command generation circuit of FIG. 2.

Referring to FIG. 6, the first replica drive circuit 44 may include inverters IV441, IV442, and IV443, a PMOS transistor P441, and NMOS transistors N441 and N442. The inverter IV441 may inversely buffer the inverted internal clock signal ICLKB to output the inversely buffered signal of the inverted internal clock signal ICLKB. The PMOS transistor P441 may drive a node ND441 to the power supply voltage VDD if an output signal of the inverter IV441 has a logic "low" level. The NMOS transistors N441 and N442 may be coupled in series between the node ND441 and the ground voltage VSS terminal. The NMOS transistor N441 may be synchronized with a rising edge of the inverted internal clock signal ICLKB to drive the node ND441 to the ground voltage VSS if the first latched control signal CAL1 having a logic "high" level is inputted to a gate of the NMOS transistor N442. The inverters IV442 and IV443 may constitute a latch circuit which latches a signal of the node ND441 and may inversely buffer the signal of the node ND441 to output the signal as the first replica chip selection drive signal RCS_DRV1. That is, the first replica drive circuit 44 may be synchronized with a rising edge of the inverted internal clock signal ICLKB to generate the first replica chip selection drive signal RCS_DRV1 having a logic "high" level if the first latched control signal CAL1 having a logic "high" level is inputted to the first replica drive circuit 44.

Figure 7:
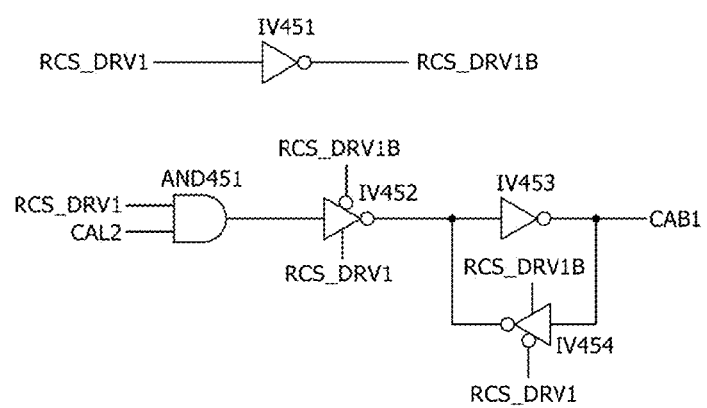
FIG. 7 is a circuit diagram illustrating an example of a first buffer control signal generation circuit included in the first command generation circuit of FIG. 2.

Referring to FIG. 7, the first buffer control signal generation circuit 45 may include inverters IV451, IV452, IV453, and IV454 and an AND gate AND451. The inverter IV451 may inversely buffer the first replica chip selection drive signal RCS_DRV1 to generate a first inverted replica chip selection drive signal RCS_DRV1B. The AND gate AND451 may receive the second latched control signal CAL2 and the first replica chip selection drive signal RCS_DRV1 to execute a logical AND operation of the second latched control signal CAL2 and the first replica chip selection drive signal RCS_DRV1. The inverter IV452 may inversely buffer an output signal of the AND gate AND451 to output the inversely buffered signal of the output signal of the AND gate AND451 if the first replica chip selection drive signal RCS_DRV1 having a logic "high" level and the first inverted replica chip selection drive signal RCS_DRV1B having a logic "low" level are inputted to the inverter IV452. The inverter IV453 may inversely buffer an output signal of the inverter IV452 to output the inversely buffered signal of the output signal of the inverter IV452 as the first buffer control signal CAB1. The inverter IV454 may inversely buffer the first buffer control signal CAB1 to feed back the inversely buffered signal of the first buffer control signal CAB1 to an input terminal of the inverter IV453 if the first replica chip selection drive signal RCS_DRV1 having a logic "low" level and the first inverted replica chip selection drive signal RCS_DRV1B having a logic "high" level are inputted to the inverter IV454. That is, the first buffer control signal generation circuit 45 may inversely buffer the second latched control signal CAL2 to generate the first buffer control signal CAB1 if the first replica chip selection drive signal RCS_DRV1 having a logic "high" level is inputted to the first buffer control signal generation circuit 45. The first buffer control signal generation circuit 45 may buffer the second latched control signal CAL2 to generate the first buffer control signal CAB1 according to embodiments.

Figure 8:
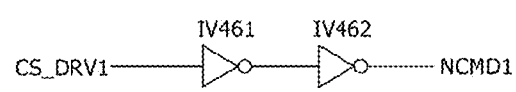
FIG. 8 is a circuit diagram illustrating an example of a first normal command output circuit included in the first command generation circuit of FIG. 2.

Referring to FIG. 8, the first normal command output circuit 46 may include inverters IV461 and IV462 which are cascaded. The first normal command output circuit 46 may buffer the first chip selection drive signal CS_DRV1 using the inverters IV461 and IV462 to generate the first normal command NCMD1.

Figure 9:
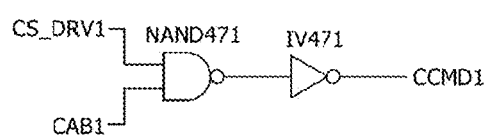
FIG. 9 is a circuit diagram illustrating an example of a first control command output circuit included in the first command generation circuit of FIG. 2.

Referring to FIG. 9, the first control command output circuit 47 may include a NAND gate NAND471 and an inverter IV471. The NAND gate NAND471 may receive the first chip selection drive signal CS_DRV1 and the first buffer control signal CAB1 to execute a logical NAND operation of the first chip selection drive signal CS_DRV1 and the first buffer control signal CAB1 and to output the result of the logical NAND operation. The inverter IV471 may inversely buffer an output signal of the NAND gate NAND471 to output the inversely buffered output signal of the NAND gate NAND471 as the first control command CCMD1. That is, the first control command output circuit 47 may buffer the first buffer control signal CAB1 to generate the first control command CCMD1 while the first chip selection drive signal CS_DRV1 having a logic "high" level is inputted to the first control command output circuit 47.

Operations of the first command generation circuit 4 having the aforementioned configuration will be described hereinafter with reference to FIGS. 10 and 11.

Figure 10:
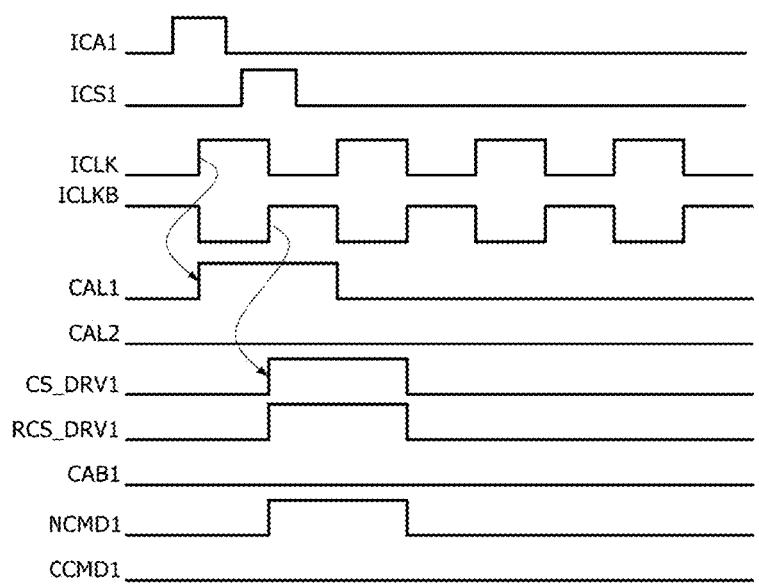
FIGS. 10 and 11 are timing diagrams illustrating operations of the semiconductor device shown in FIGS. 1 to 9.

Referring to FIG. 10, an operation for generating the first normal command NCMD1 is illustrated. Specifically, the first command generation circuit 4 may latch the first internal control signal ICA1 having a logic "high" level in synchronization with a rising edge of the internal clock signal ICLK and the first control signal latch circuit 41 of the first command generation circuit 4 may generate the first latched control signal CAL1. If the first internal chip selection signal ICS1 having a logic "high" level is inputted to the first command generation circuit 4 in synchronization with a rising edge of the inverted internal clock signal ICLKB while the first latched control signal CAL1 has a logic "high" level, the first chip selection drive signal CS_DRV1 may be driven to a logic "high" level. The first normal command output circuit 46 may drive the first chip selection drive signal CS_DRV1 driven to a logic "high" level which may be buffered and first normal command output circuit 46 may output the first normal command NCMD1.

Figure 11:
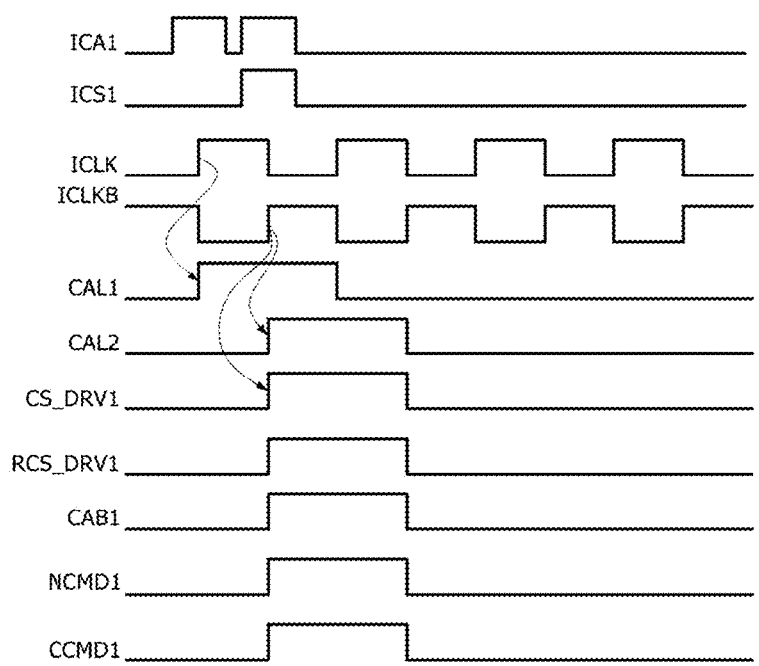

Referring to FIG. 11, an operation for generating the first normal command NCMD1 and the first control command CCMD1 is illustrated. Specifically, the first command generation circuit 4 may latch the first internal control signal ICA1 having a logic "high" level in synchronization with a rising edge of the internal clock signal ICLK and the first control signal latch circuit 41 of the first command generation circuit 4 may generate the first latched control signal CAL1. If the first internal chip selection signal ICS1 having a logic "high" level is inputted to the first command generation circuit 4 in synchronization with a rising edge of the inverted internal clock signal ICLKB while the first latched control signal CAL1 has a logic "high" level, the first chip selection drive signal CS_DRV1 may be driven to a logic "high" level. The first chip selection drive signal CS_DRV1 driven to a logic "high" level may be buffered and outputted as the first normal command NCMD1. While the first latched control signal CAL1 has a logic "high" level, the first replica drive circuit 44 of the first command generation circuit 4 may drive the first replica chip selection drive signal RCS_DRV1 to a logic "high" level in synchronization with a rising edge of the inverted internal clock signal ICLKB. If the first internal control signal ICA1 having a logic "high" level is inputted to the first command generation circuit 4 in synchronization with a rising edge of the inverted internal clock signal ICLKB while the first replica chip selection drive signal RCS_DRV1 is driven to have a logic "high" level, the second control signal latch circuit 42 of the first command generation circuit 4 may generate the second latched control signal CAL2 having a logic "high" level. The first buffer control signal generation circuit 45 of the first command generation circuit 4 may drive the first buffer control signal CAB1 to have a logic "high" level if both of the first replica chip selection drive signal RCS_DRV1 and the first internal control signal ICA1 have a logic "high" level, and the first control command output circuit 47 of the first command generation circuit 4 may buffer and output the first buffer control signal CAB1 as the first control command CCMD1 while the first chip selection drive signal CS_DRV1 has a logic "high" level.

As described above, the first command generation circuit 4 included the semiconductor device according to an embodiment may generate the first normal command NCMD1 and the first control command CCMD1 using the first latched control signal CAL1 and the first chip selection drive signal CS_DRV1 which are generated in synchronization with the internal clock signal ICLK and the inverted internal clock signal ICLKB. Thus, the first normal command NCMD1 and the first control command CCMD1 may be controlled to be generated at the same time.

Figure 12:
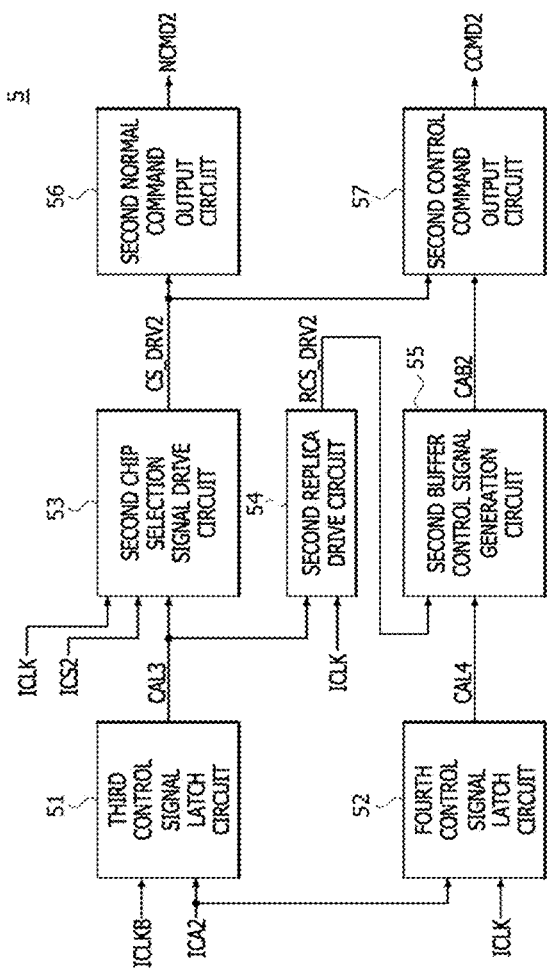
FIG. 12 is a block diagram illustrating a configuration of an example of a second command generation circuit included in the semiconductor device of FIG. 1.

Referring to FIG. 12, the second command generation circuit 5 may include a third control signal latch circuit 51, a fourth control signal latch circuit 52, a second chip selection signal drive circuit 53, a second replica drive circuit 54, a second buffer control signal generation circuit 55, a second normal command output circuit 56, and a second control command output circuit 57.

The third control signal latch circuit 51 may be synchronized with the inverted internal clock signal ICLKB to latch the second internal control signal ICA2 and to generate a third latched control signal CAL3. The third control signal latch circuit 51 may latch the second internal control signal ICA2 to output the latched first internal control signal as the third latched control signal CAL3 if the second internal control signal ICA2 having a predetermined state is inputted to the third control signal latch circuit 51 in synchronization with a predetermined edge of the inverted internal clock signal ICLKB. The predetermined edge of the inverted internal clock signal ICLKB may be set as a rising edge or a falling edge according to embodiments. If the second internal control signal ICA2 is a signal having one bit, the predetermined state of the second internal control signal ICA2 may be set to a logic "low" level or a logic "high" level according to embodiments. Alternatively, if the second internal control signal ICA2 is a signal including a plurality of bits, the predetermined state of the second internal control signal ICA2 may correspond to a predetermined logic level combination.

The fourth control signal latch circuit 52 may be synchronized with the internal clock signal ICLK to latch the second internal control signal ICA2 to generate a fourth latched control signal CAL4. The fourth control signal latch circuit 52 may latch the second internal control signal ICA2 to output the latched second internal control signal as the fourth latched control signal CAL4 if the second internal control signal ICA2 having a predetermined state is inputted to the fourth control signal latch circuit 52 in synchronization with a predetermined edge of the internal clock signal ICLK. The predetermined edge of the internal clock signal ICLK may be set as a rising edge or a falling edge according to embodiments. If the second internal control signal ICA2 is a signal having one bit, the predetermined state of the second internal control signal ICA2 may be set to a logic "low" level or a logic "high" level according to embodiments. Alternatively, if the second internal control signal ICA2 is a signal including a plurality of bits, the predetermined state of the second internal control signal ICA2 may correspond to a predetermined logic level combination.

The second chip selection signal drive circuit 53 may generate a second chip selection drive signal CS_DRV2 in response to the internal clock signal ICLK, the third latched control signal CAL3, and the second internal chip selection signal ICS2. The second chip selection signal drive circuit 53 may drive the second chip selection drive signal CS_DRV2 if the second internal chip selection signal ICS2 having a predetermined state is inputted to the second chip selection signal drive circuit 53 in synchronization with the internal clock signal ICLK while the third latched control signal CAL3 having a predetermined state is inputted to the second chip selection signal drive circuit 53. The second chip selection signal drive circuit 53 may drive the second chip selection drive signal CS_DRV2 at a predetermined edge of the internal clock signal ICLK. The predetermined edge of the internal clock signal ICLK may be set as a rising edge or a falling edge according to embodiments. If the third latched control signal CAL3 is a signal having one bit, the predetermined state of the third latched control signal CAL3 may be set to a logic "low" level or a logic "high" level according to embodiments. Alternatively, if the third latched control signal CAL3 is a signal including a plurality of bits, the predetermined state of the third latched control signal CAL3 may correspond to a predetermined logic level combination. In addition, if the second internal chip selection signal ICS2 is a signal having one bit, the predetermined state of the second internal chip selection signal ICS2 may be set to a logic "low" level or a logic "high" level according to embodiments. Alternatively, if the second internal chip selection signal ICS2 is a signal including a plurality of bits, the predetermined state of the second internal chip selection signal ICS2 may correspond to a predetermined logic level combination. The second chip selection signal drive circuit 53 may drive the second chip selection drive signal CS_DRV2 to a power supply voltage or a ground voltage according to embodiments.

The second replica drive circuit 54 may generate a second replica chip selection drive signal RCS_DRV2 in response to the internal clock signal ICLK and the third latched control signal CAL3. The second replica drive circuit 54 may be synchronized with the internal clock signal ICLK to drive the second replica chip selection drive signal RCS_DRV2 when the third latched control signal CAL3 having a predetermined state is inputted to the second replica drive circuit 54. The second replica drive circuit 54 may drive the second replica chip selection drive signal RCS_DRV2 to a predetermined edge of the internal clock signal ICLK. The predetermined edge of the internal clock signal ICLK may be set as a rising edge or a falling edge according to embodiments. If the third latched control signal CAL3 is a signal having one bit, the predetermined state of the third latched control signal CAL3 may be set to a logic "low" level or a logic "high" level according to embodiments. Alternatively, if the third latched control signal CAL3 is a signal including a plurality of bits, the predetermined state of the third latched control signal CAL3 may correspond to a predetermined logic level combination. The second replica drive circuit 54 may drive the second replica chip selection drive signal RCS_DRV2 to a power supply voltage or a ground voltage according to embodiments.

The second buffer control signal generation circuit 55 may generate a second buffer control signal CAB2 from the fourth latched control signal CAL4 in response to the second replica chip selection drive signal RCS_DRV2. The second buffer control signal generation circuit 55 may buffer the fourth latched control signal CAL4 to generate the second buffer control signal CAB2 if the second replica chip selection drive signal RCS_DRV2 having a predetermined state is inputted to the second buffer control signal generation circuit 55. If the second replica chip selection drive signal RCS_DRV2 is a signal having one bit, the predetermined state of the second replica chip selection drive signal RCS_DRV2 may be set to a logic "low" level or a logic "high" level according to embodiments. Alternatively, if the second replica chip selection drive signal RCS_DRV2 is a signal including a plurality of bits, the predetermined state of the second replica chip selection drive signal RCS_DRV2 may correspond to a predetermined logic level combination.

The second normal command output circuit 56 may generate the second normal command NCMD2 in response to the second chip selection drive signal CS_DRV2. The second normal command output circuit 56 may buffer the second chip selection drive signal CS_DRV2 to generate the second normal command NCMD2.

The second control command output circuit 57 may generate the second control command CCMD2 in response to the second chip selection drive signal CS_DRV2 and the second buffer control signal CAB2. The second control command output circuit 57 may buffer the second buffer control signal CAB2 to generate the second control command CCMD2 while the second chip selection drive signal CS_DRV2 having a predetermined state is inputted to the second control command output circuit 57. If the second chip selection drive signal CS_DRV2 is a signal having one bit, the predetermined state of the second chip selection drive signal CS_DRV2 may be set to a logic "low" level or a logic "high" level according to embodiments. Alternatively, if the second chip selection drive signal CS_DRV2 is a signal including a plurality of bits, the predetermined state of the second chip selection drive signal CS_DRV2 may correspond to a predetermined logic level combination.

Figure 13:
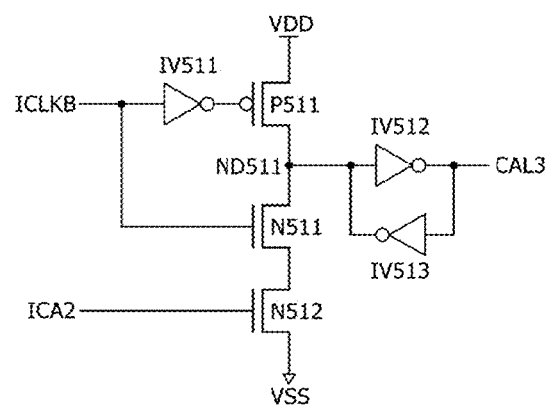
FIG. 13 is a circuit diagram illustrating an example of a third control signal latch circuit included in the second command generation circuit of FIG. 12.

Referring to FIG. 13, the third control signal latch circuit 51 may include inverters IV511, IV512, and IV513, a PMOS transistor P511, and NMOS transistors N511 and N512. The inverter IV511 may inversely buffer the inverted internal clock signal ICLKB to output the inversely buffered signal of the inverted internal clock signal ICLKB. The PMOS transistor P511 may drive a node ND511 to a power supply voltage VDD if an output signal of the inverter IV511 has a logic "low" level. The NMOS transistors N511 and N512 may be coupled in series between the node ND511 and a ground voltage VSS terminal. The NMOS transistor N511 may be synchronized with a rising edge of the inverted internal clock signal ICLKB to drive the node ND511 to the ground voltage VSS if the second internal control signal ICA2 having a logic "high" level is inputted to a gate of the NMOS transistor N512. The inverters IV512 and IV513 may constitute a latch circuit which latches a signal of the node ND511 and may inversely buffer the signal of the node ND511 to output the signal as the third latched control signal CAL3. That is, the third control signal latch circuit 51 may be synchronized with a rising edge of the inverted internal clock signal ICLKB to generate the third latched control signal CAL3 having a logic "high" level if the second internal control signal ICA2 having a logic "high" level is inputted to the third control signal latch circuit 51.

Figure 14:
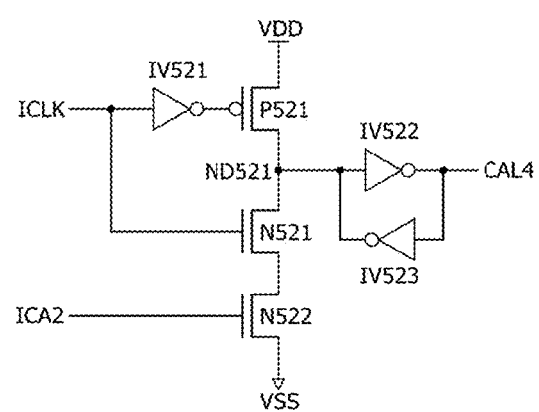
FIG. 14 is a circuit diagram illustrating an example of a fourth control signal latch circuit included in the second command generation circuit of FIG. 12.

Referring to FIG. 14, the fourth control signal latch circuit 52 may include inverters IV521, IV522, and IV523, a PMOS transistor P521, and NMOS transistors N521 and N522. The inverter IV521 may inversely buffer the internal clock signal ICLK to output the inversely buffered signal of the internal clock signal ICLK. The PMOS transistor P521 may drive a node ND521 to the power supply voltage VDD if an output signal of the inverter IV521 has a logic "low" level. The NMOS transistors N521 and N522 may be coupled in series between the node ND521 and the ground voltage VSS terminal. The NMOS transistor N521 may be synchronized with a rising edge of the internal clock signal ICLK to drive the node ND521 to the ground voltage VSS if the second internal control signal ICA2 having a logic "high" level is inputted to a gate of the NMOS transistor N522. The inverters IV522 and IV523 may constitute a latch circuit which latches a signal of the node ND521 and may inversely buffer the signal of the node ND521 to output the signal as the fourth latched control signal CAL4. That is, the fourth control signal latch circuit 52 may be synchronized with a rising edge of the internal clock signal ICLK to generate the fourth latched control signal CAL4 having a logic "high" level if the second internal control signal ICA2 having a logic "high" level is inputted to the fourth control signal latch circuit 52.

Figure 15:
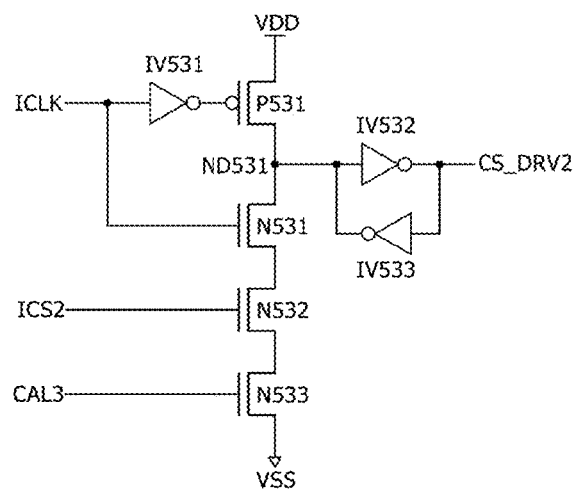
FIG. 15 is a circuit diagram illustrating an example of a second chip selection signal drive circuit included in the second command generation circuit of FIG. 12.

Referring to FIG. 15, the second chip selection signal drive circuit 53 may include inverters IV531, IV532, and IV533, a PMOS transistor P531, and NMOS transistors N531, N532, and N533. The inverter IV531 may inversely buffer the internal clock signal ICLK to output the inversely buffered signal of the internal clock signal ICLK. The PMOS transistor P531 may drive a node ND531 to the power supply voltage VDD if an output signal of the inverter IV531 has a logic "low" level. The NMOS transistors N531, N532, and N533 may be coupled in series between the node ND531 and the ground voltage VSS terminal. The NMOS transistor N531 may be synchronized with a rising edge of the internal clock signal ICLK to drive the node ND531 to the ground voltage VSS if the second internal chip selection signal ICS2 having a logic "high" level and the third latched control signal CAL3 having a logic "high" level are respectively inputted to gates of the NMOS transistors N532 and N533. The inverters IV532 and IV533 may constitute a latch circuit which latches a signal of the node ND531 and may inversely buffer the signal of the node ND531 to output the signal as the second chip selection drive signal CS_DRV2. That is, the second chip selection signal drive circuit 53 may be synchronized with a rising edge of the internal clock signal ICLK to generate the second chip selection drive signal CS_DRV2 having a logic "high" level if the second internal chip selection signal ICS2 having a logic "high" level and the third latched control signal CAL3 having a logic "high" level are inputted to the second chip selection signal drive circuit 53.

Figure 16:
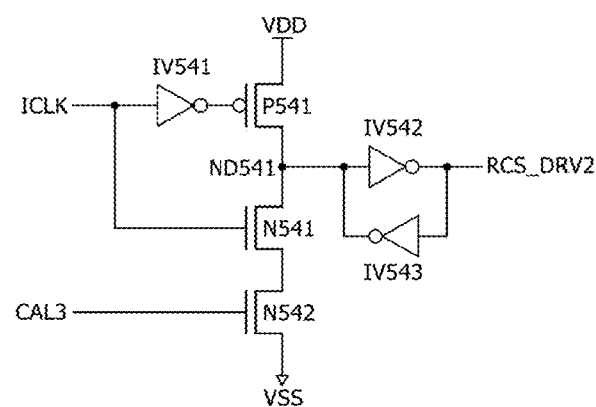
FIG. 16 is a circuit diagram illustrating an example of a second replica drive circuit included in the second command generation circuit of FIG. 12.

Referring to FIG. 16, the second replica drive circuit 54 may include inverters IV541, IV542, and IV543, a PMOS transistor P541 and NMOS transistors N541 and N542. The inverter IV541 may inversely buffer the internal clock signal ICLK to output the inversely buffered signal of the internal clock signal ICLK. The PMOS transistor P541 may drive a node ND541 to the power supply voltage VDD if an output signal of the inverter IV541 has a logic "low" level. The NMOS transistors N541 and N542 may be coupled in series between the node ND541 and the ground voltage VSS terminal. The NMOS transistor N541 may be synchronized with a rising edge of the internal clock signal ICLK to drive the node ND541 to the ground voltage VSS if the third latched control signal CAL3 having a logic "high" level is inputted to a gate of the NMOS transistor N542. The inverters IV542 and IV543 may constitute a latch circuit which latches a signal of the node ND541 and may inversely buffer the signal of the node ND541 to output the signal as the second replica chip selection drive signal RCS_DRV2. That is, the second replica drive circuit 54 may be synchronized with a rising edge of the internal clock signal ICLK to generate the second replica chip selection drive signal RCS_DRV2 having a logic "high" level if the third latched control signal CAL3 having a logic "high" level is inputted to the second replica drive circuit 54.

Figure 17:
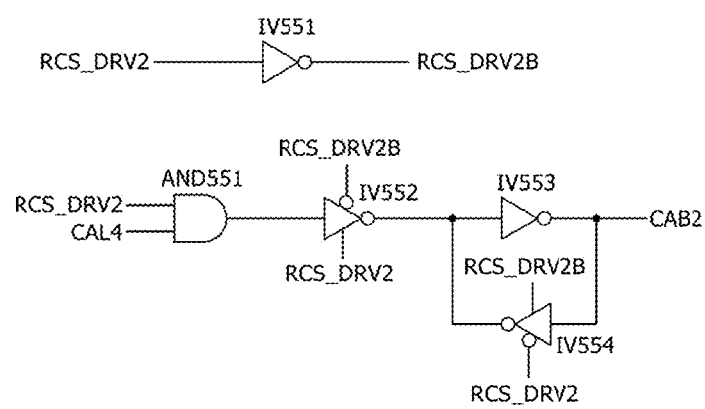
FIG. 17 is a circuit diagram illustrating an example of a second buffer control signal generation circuit included in the second command generation circuit of FIG. 12.

Referring to FIG. 17, the second buffer control signal generation circuit 55 may include inverters IV551, IV552, IV553, and IV554 and an AND gate AND551. The inverter IV551 may inversely buffer the second replica chip selection drive signal RCS_DRV2 to generate a second inverted replica chip selection drive signal RCS_DRV2B. The AND gate AND551 may receive the fourth latched control signal CAL4 and the second replica chip selection drive signal RCS_DRV2 to execute a logical AND operation of the fourth latched control signal CAL4 and the second replica chip selection drive signal RCS_DRV2. The inverter IV552 may inversely buffer an output signal of the AND gate AND551 to output the inversely buffered signal of the output signal of the AND gate AND551 if the second replica chip selection drive signal RCS_DRV2 having a logic "high" level and the second inverted replica chip selection drive signal RCS_DRV2B having a logic "low" level are inputted to the inverter IV552. The inverter IV553 may inversely buffer an output signal of the inverter IV552 to output the inversely buffered signal of the output signal of the inverter IV552 as the second buffer control signal CAB2. The inverter IV554 may inversely buffer the second buffer control signal CAB2 to feed back the inversely buffered signal of the second buffer control signal CAB2 to an input terminal of the inverter IV553 if the second replica chip selection drive signal RCS_DRV2 having a logic "low" level and the second inverted replica chip selection drive signal RCS_DRV2B having a logic "high" level are inputted to the inverter IV554. That is, the second buffer control signal generation circuit 55 may inversely buffer the fourth latched control signal CAL4 to generate the second buffer control signal CAB2 if the second replica chip selection drive signal RCS_DRV2 having a logic "high" level is inputted to the second buffer control signal generation circuit 55. The second buffer control signal generation circuit 55 may buffer the fourth latched control signal CAL4 to generate the second buffer control signal CAB2 according to embodiments.

Figure 18:
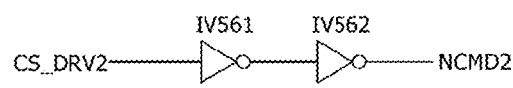
FIG. 18 is a circuit diagram illustrating an example of a second normal command output circuit included in the second command generation circuit of FIG. 12.

Referring to FIG. 18, the second normal command output circuit 56 may include inverters IV561 and IV562 which are cascaded. The second normal command output circuit 56 may buffer the second chip selection drive signal CS_DRV2 using the inverters IV561 and IV562 to generate the second normal command NCMD2.

Figure 19:
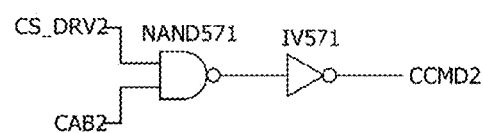
FIG. 19 is a circuit diagram illustrating an example of a second control command output circuit included in the second command generation circuit of FIG. 12.

Referring to FIG. 19, the second control command output circuit 57 may include a NAND gate NAND571 and an inverter IV571. The NAND gate NAND571 may receive the second chip selection drive signal CS_DRV2 and the second buffer control signal CAB2 to execute a logical NAND operation of the second chip selection drive signal CS_DRV2 and the second buffer control signal CAB2 and to output the result of the logical NAND operation. The inverter IV571 may inversely buffer an output signal of the NAND gate NAND571 to output the inversely buffered signal of the output signal of the NAND gate NAND571 as the second control command CCMD2. That is, the second control command output circuit 57 may buffer the second buffer control signal CAB2 to generate the second control command CCMD2 when the second chip selection drive signal CS_DRV2 having a logic "high" level is inputted to the second control command output circuit 57.

Operations of the second command generation circuit 5 having the aforementioned configuration will be described hereinafter with reference to FIGS. 20 and 21.

Figure 20:
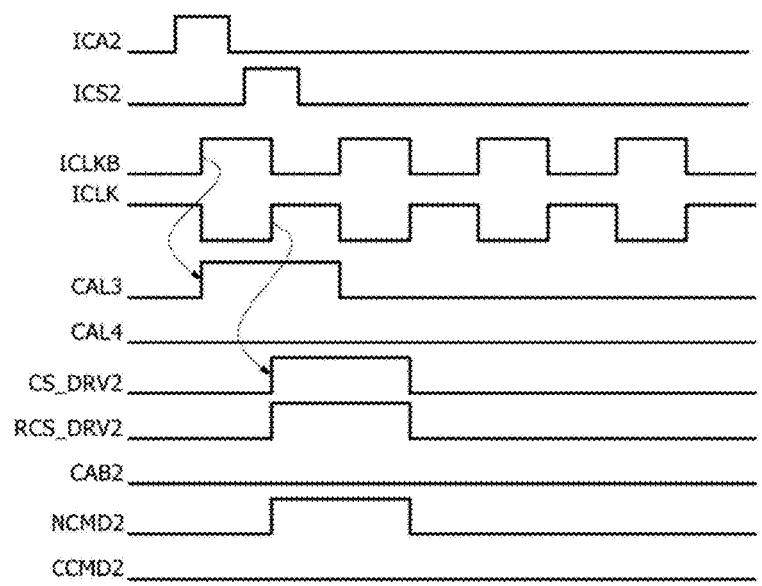
FIGS. 20 and 21 are timing diagrams illustrating operations of the semiconductor device shown in FIGS. 12 to 19.

Referring to FIG. 20, an operation for generating the second normal command NCMD2 is illustrated. Specifically, the third control signal latch circuit 51 of the second command generation circuit 5 may latch the second internal control signal ICA2 having a logic "high" level in synchronization with a rising edge of the inverted internal clock signal ICLKB to generate the third latched control signal CAL3. If the second internal chip selection signal ICS2 having a logic "high" level is inputted to the second command generation circuit 5 in synchronization with a rising edge of the internal clock signal ICLK while the third latched control signal CAL3 has a logic "high" level, second chip selection signal drive circuit 53 of the second command generation circuit 5 may drive the second chip selection drive signal CS_DRV2 to a logic "high" level. The second normal command output circuit 56 of the second command generation circuit 5 may buffer and output the second chip selection drive signal CS_DRV2 driven to a logic "high" level as the second normal command NCMD2.

Figure 21:
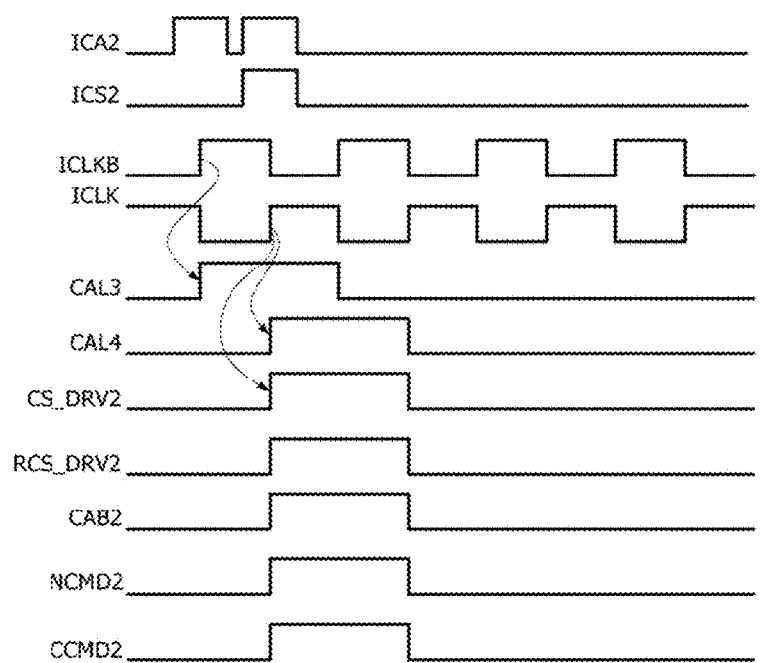

Referring to FIG. 21, an operation for generating the second normal command NCMD2 and the second control command CCMD2 is illustrated. Specifically, the third control signal latch circuit 51 of the second command generation circuit 5 may latch the second internal control signal ICA2 having a logic "high" level in synchronization with a rising edge of the inverted internal clock signal ICLKB to generate the third latched control signal CAL3. If the second internal chip selection signal ICS2 having a logic "high" level is inputted to the second command generation circuit 5 in synchronization with a rising edge of the internal clock signal ICLK while the third latched control signal CAL3 has a logic "high" level, the second chip selection signal drive circuit 53 of the second command generation circuit 5 may drive the second chip selection drive signal CS_DRV2 to a logic "high" level. The second normal command output circuit 56 of the second command generation circuit 5 may buffer and output the second chip selection drive signal CS_DRV2 driven to a logic "high" level as the second normal command NCMD2. While the third latched control signal CAL3 has a logic "high" level, the second replica drive circuit 54 of the second command generation circuit 5 may drive the second replica chip selection drive signal RCS_DRV2 to a logic "high" level in synchronization with a rising edge of the internal clock signal ICLK. If the second internal control signal ICA2 having a logic "high" level is inputted to the second command generation circuit 5 in synchronization with a rising edge of the internal clock signal ICLK when the second replica chip selection drive signal RCS_DRV2 is driven to have a logic "high" level, the fourth control signal latch circuit 52 of the second command generation circuit 5 may generate the fourth latched control signal CAL4 having a logic "high" level. The second buffer control signal generation circuit 55 of the second command generation circuit 5 may drive the second buffer control signal CAB2 have a logic "high" level if both of the second replica chip selection drive signal RCS_DRV2 and the second internal control signal ICA2 have a logic "high" level. The second buffer control signal generation circuit 55 may buffer and output the second buffer control signal CAB2 as the second control command CCMD2 while the second chip selection drive signal CS_DRV2 has a logic "high" level.

As described above, the second command generation circuit 5 included in the semiconductor device according to an embodiment may generate the second normal command NCMD2 and the second control command CCMD2 using the third latched control signal CAL3 and the second chip selection drive signal CS_DRV2 which are generated in synchronization with the internal clock signal ICLK and the inverted internal clock signal ICLKB. Thus, the second normal command NCMD2 and the second control command CCMD2 may be controlled to be generated at the same time.

Referring to FIG. 22, logic level combinations of bits CA1~CA5 included in the control signal CA for generating the normal commands and control commands are illustrated.

If the bits CA1~CA5 included in the control signal CA have a logic level combination of 'H, L, H, L, L' while the chip selection signal CS has a logic "low(L)" level, a normal command for executing a mode register write operation may be generated. In a logic level combination of the bits CA1~CA5 included in the control signal CA, the logic level combination of 'H, L, H, L, L' means that the bits CA1 and CA3 have a logic "high" level and the bits CA2, CA4, and CA5 have a logic "low" level. A logic level combination of the bits CA1~CA5 included in the control signal CA for generating the normal command for executing the mode register write operation may be set to be different according to embodiments. After the bits CA1~CA5 included in the control signal CA are set to have a logic level combination of 'H, L, H, L, L' while the chip selection signal CS has a logic "low(L)" level, a control command for executing the mode register write operation may be generated if a bit CA10 included in the control signal CA has a logic "high" level while the chip selection signal CS has a logic "high (H)" level. A logic level of the bit CA10 included in the control signal CA for generating the control command for executing the mode register write operation may be set to be different according to embodiments.

If the bits CA1~CA5 included in the control signal CA have a logic level combination of 'H, L, H, L, H' while the chip selection signal CS has a logic "low(L)" level, a normal command for executing a mode register read operation may be generated. In a logic level combination of the bits CA1~CA5 included in the control signal CA, the logic level combination of 'H, L, H, L, H' means that the bits CA1, CA3 and CA5 have a logic "high" level and the bits CA2 and CA4 have a logic "low" level. A logic level combination of the bits CA1~CA5 included in the control signal CA for generating the normal command for executing the mode register read operation may be set to be different according to embodiments. After the bits CA1~CA5 included in the control signal CA are set to have a logic level combination of 'H, L, H, L, H' while the chip selection signal CS has a logic "low(L)" level, a control command for executing the mode register read operation may be generated if the bit CA10 included in the control signal CA has a logic "high" level while the chip selection signal CS has a logic "high (H)" level. A logic level of the bit CA10 included in the control signal CA for generating the control command for executing the mode register read operation may be set to be different according to embodiments.

Figure 23:
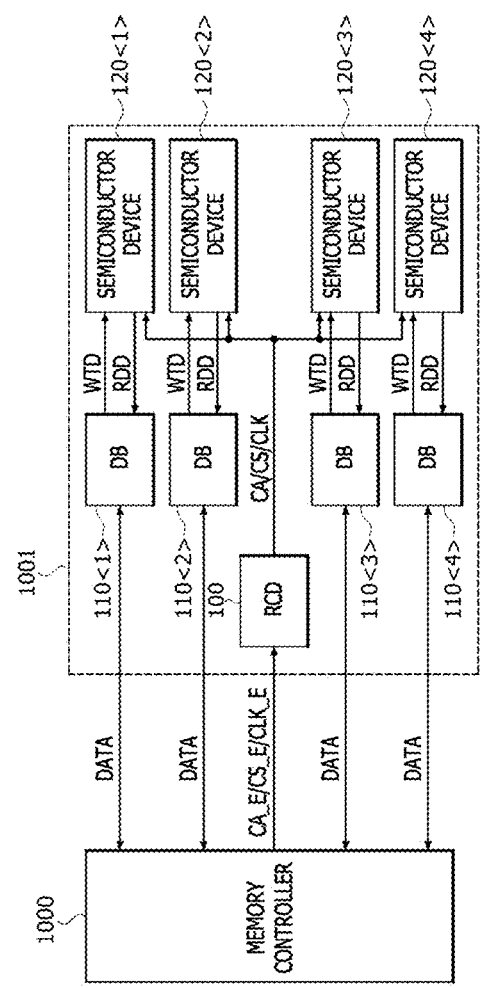
FIG. 23 is a block diagram illustrating a configuration of a semiconductor system according to an embodiment of the present disclosure.

Referring to FIG. 23, a semiconductor system according an embodiment may include a semiconductor controller 1000 (also, referred to as 'a memory controller') and a semiconductor module 1001 (also, referred to as 'a memory module').

The memory controller 1000 may be included in a host. The memory controller 1000 may apply an external control signal CA_E, an external chip selection signal CS_E, and an external clock signal CLK_E to the memory module 1001 to control the memory module 1001. The memory controller 1000 may receive data DATA from the memory module 1001 or may transmit the data DATA to the memory module 1001. That is, the memory controller 1000 may communicate data DATA with the memory module 1001.

The memory module 1001 may include a register clock driver (RCD) 100, a plurality of data buffers (e.g., first to fourth data buffers 110<1:4>), and a plurality of semiconductor devices (e.g., first to fourth semiconductor devices 120<1:4>). The memory module 1001 may be a dual in-line memory module (DIMM).

The RCD 100 may buffer the external control signal CA_E, the external chip selection signal CS_E, and the external clock signal CLK_E outputted from the memory controller 1000 to generate a control signal CA, a chip selection signal CS, and a clock signal CLK. The RCD 100 may apply the control signal CA, the chip selection signal CS, and the clock signal CLK to each of the first to fourth semiconductor devices 120<1:4>.

The first to fourth data buffers 110<1:4> may buffer the data DATA outputted from the memory controller 1000 to generate write data WTD and may transmit the write data WTD to the first to fourth semiconductor devices 120<1:4>, during a write operation. The first to fourth data buffers 110<1:4> may buffer read data RDD outputted from the first to fourth semiconductor devices 120<1:4> to generate the data DATA and may transmit the data DATA to the memory controller 1000, during a read operation.

Each of the first to fourth semiconductor devices 120<1:4> may receive the control signal CA, the chip selection signal CS, and the clock signal CLK to generate a normal command and a control command for executing an internal operation thereof. Each of the first to fourth semiconductor devices 120<1:4> may be realized using the semiconductor device described with reference to FIGS. 1 to 22. The normal commands generated by the first to fourth semiconductor devices 120<1:4> may be used in execution of a mode register write operation and a mode register read operation for setting information on operations of the first to fourth semiconductor devices 120<1:4>. The control commands generated by the first to fourth semiconductor devices 120<1:4> may be used in execution of a mode register write operation and a mode register read operation for setting information on operations of the RCD 100.

What is claimed is:
1. A semiconductor device comprising:
a latch circuit configured to generate a first internal control signal and a first internal chip selection signal in synchronization with an internal clock signal; and
a first command generation circuit configured to generate a first normal command if the first internal chip selection signal having an enabled state is inputted to the first command generation circuit in synchronization with an inverted internal clock signal while the first internal control signal having a first predetermined state is inputted to the first command generation circuit in synchronization with the internal clock signal, and configured to generate a first control command if the first internal control signal having a second predetermined state is inputted to the first command generation circuit in synchronization with the inverted internal clock signal while the first internal control signal having the first predetermined state is inputted to the first command generation circuit in synchronization with the internal clock signal.
2. The semiconductor device of claim 1, wherein the first internal control signal is generated by latching an input control signal, which is generated by buffering a control signal, in synchronization with the internal clock signal.
3. The semiconductor device of claim 1, wherein the first internal chip selection signal is generated by latching an input chip selection signal, which is generated by buffering a chip selection signal, in synchronization with the internal clock signal.

4. The semiconductor device of claim 1,
wherein if the first internal control signal is a signal having one bit, the first predetermined state of the first internal control signal has a predetermined logic level; and
wherein if the first internal control signal is a signal including a plurality of bits, the first predetermined state of the first internal control signal has a predetermined logic level combination.

5. The semiconductor device of claim 1, wherein the first predetermined state of the first internal control signal is equal to the second predetermined state of the first internal control signal.

6. The semiconductor device of claim 1, wherein the first command generation circuit includes:
a first control signal latch circuit configured to latch the first internal control signal to generate a first latched control signal, in synchronization with the internal clock signal;
a chip selection signal drive circuit configured to receive the first latched control signal and the first internal chip selection signal to drive a chip selection drive signal in synchronization with the inverted internal clock signal; and
a normal command output circuit configured to buffer the chip selection drive signal to generate the first normal command.

7. The semiconductor device of claim 6, wherein the first control signal latch circuit drives the first latched control signal to a predetermined logic level if the first internal control signal having the first predetermined state is inputted to the first control signal latch circuit in synchronization with a rising edge of the internal clock signal.

8. The semiconductor device of claim 6, wherein the chip selection signal drive circuit drives the chip selection drive signal to a predetermined logic level if the first internal chip selection signal having an enabled state is inputted to the chip selection signal drive circuit in synchronization with a rising edge of the inverted internal clock signal while the first latched control signal having a predetermined logic level is inputted to the chip selection signal drive circuit.

9. The semiconductor device of claim 6, wherein the first command generation circuit further includes:
a second control signal latch circuit configured to latch the first internal control signal to generate a second latched control signal, in synchronization with the inverted internal clock signal;
a replica drive circuit configured to receive the first latched control signal to drive a replica chip selection drive signal, in synchronization with the inverted internal clock signal;
a buffer control signal generation circuit configured to buffer the second latched control signal to generate a buffer control signal, in response to the replica chip selection drive signal; and
a control command output circuit configured to buffer the buffer control signal to generate the first control command, in response to the chip selection drive signal.

10. The semiconductor device of claim 9, wherein the replica chip selection drive signal and the chip selection drive signal are controlled to be generated at a same time.

11. The semiconductor device of claim 1, wherein the latch circuit is configured to generate a second internal control signal and a second internal chip selection signal in synchronization with the inverted internal clock signal.

12. The semiconductor device of claim 11, further comprising a second command generation circuit configured to generate a second normal command if the second internal chip selection signal having an enabled state is inputted to the second command generation circuit in synchronization with the internal clock signal while the second internal control signal having a third predetermined state is inputted to the second command generation circuit in synchronization with the inverted internal clock signal, and configured to generate a second control command if the second internal control signal having a fourth predetermined state is inputted to the second command generation circuit in synchronization with the internal clock signal while the second internal control signal having the third predetermined state is inputted to the second command generation circuit in synchronization with the inverted internal clock signal.

13. A semiconductor device comprising:
a first command generation circuit configured to generate a first normal command if a first internal chip selection signal having an enabled state is inputted to the first command generation circuit in synchronization with an inverted internal clock signal while a first internal control signal having a first predetermined state is inputted to the first command generation circuit in synchronization with an internal clock signal, and configured to generate a first control command if the first internal control signal having a second predetermined state is inputted to the first command generation circuit in synchronization with the inverted internal clock signal while the first internal control signal having the first predetermined state is inputted to the first command generation circuit in synchronization with the internal clock signal; and
a second command generation circuit configured to generate a second normal command if a second internal chip selection signal having an enabled state is inputted to the second command generation circuit in synchronization with the internal clock signal while a second internal control signal having a third predetermined state is inputted to the second command generation circuit in synchronization with the inverted internal clock signal, and configured to generate a second control command if the second internal control signal having a fourth predetermined state is inputted to the second command generation circuit in synchronization with the internal clock signal while the second internal control signal having the third predetermined state is inputted to the second command generation circuit in synchronization with the inverted internal clock signal.

14. The semiconductor device of claim 13, further comprising a latch circuit configured to generate the first internal control signal and the first internal chip selection signal in synchronization with the internal clock signal, and configured to generate the second internal control signal and the second internal chip selection signal in synchronization with the inverted internal clock signal.

15. The semiconductor device of claim 14,
wherein the first internal control signal is generated by latching an input control signal, which is generated by buffering a control signal, in synchronization with the internal clock signal;
wherein the first internal chip selection signal is generated by latching an input chip selection signal, which is generated by buffering a chip selection signal, in synchronization with the internal clock signal;
wherein the second internal control signal is generated by latching the input control signal in synchronization with the inverted internal clock signal; and wherein the second internal chip selection signal is generated by latching the input chip selection signal in synchronization with the inverted internal clock signal.

16. The semiconductor device of claim 13, wherein the first command generation circuit includes:
   a first control signal latch circuit configured to latch the first internal control signal to generate a first latched control signal, in synchronization with the internal clock signal;
   a chip selection signal drive circuit configured to receive the first latched control signal and the first internal chip selection signal to drive a chip selection drive signal in synchronization with the inverted internal clock signal; and
   a normal command output circuit configured to buffer the chip selection drive signal to generate the first normal command.

17. The semiconductor device of claim 16, wherein the first control signal latch circuit drives the first latched control signal to a predetermined logic level if the first internal control signal having the first predetermined state is inputted to the first control signal latch circuit in synchronization with a rising edge of the internal clock signal.

18. The semiconductor device of claim 16, wherein the chip selection signal drive circuit drives the chip selection drive signal to a predetermined logic level if the first internal chip selection signal having an enabled state is inputted to the chip selection signal drive circuit in synchronization with a rising edge of the inverted internal clock signal while the first latched control signal having a predetermined logic level is inputted to the chip selection signal drive circuit.

19. The semiconductor device of claim 16, wherein the first command generation circuit further includes:
   a second control signal latch circuit configured to latch the first internal control signal to generate a second latched control signal, in synchronization with the inverted internal clock signal;
   a replica drive circuit configured to receive the first latched control signal to drive a replica chip selection drive signal, in synchronization with the inverted internal clock signal;
   a buffer control signal generation circuit configured to buffer the second latched control signal to generate a buffer control signal, in response to the replica chip selection drive signal; and
   a control command output circuit configured to buffer the buffer control signal to generate the first control command, in response to the chip selection drive signal.

20. A semiconductor system comprising:
   a semiconductor controller configured to generate an external control signal, an external chip selection signal and an external clock signal; and
   a semiconductor module configured to receive the external control signal, the external chip selection signal, and the external clock signal to communicate data with the semiconductor controller,
   wherein the semiconductor module includes:
   a register clock driver configured to generate a control signal, a chip selection signal, and a clock signal from the external control signal, the external chip selection signal, and the external clock signal; and
   a first command generation circuit configured to generate a first normal command and a first control command in response to the control signal, the chip selection signal and the clock signal,
   wherein the first normal command is generated if a first internal chip selection signal having an enabled state is inputted to the first command generation circuit in synchronization with an inverted internal clock signal while a first internal control signal having a first predetermined state is inputted to the first command generation circuit in synchronization with an internal clock signal, and
   wherein the first control command is generated if the first internal control signal having a second predetermined state is inputted to the first command generation circuit in synchronization with the inverted internal clock signal while the first internal control signal having the first predetermined state is inputted to the first command generation circuit in synchronization with the internal clock signal.

* * * * *